(12) United States Patent
Gonya et al.

(10) Patent No.: US 10,123,410 B2
(45) Date of Patent: Nov. 6, 2018

(54) FINE LINE 3D NON-PLANAR CONFORMING CIRCUIT

(71) Applicant: Lockheed Martin Corporation, Bethesda, MD (US)

(72) Inventors: Stephen Gonya, Endicott, NY (US); James Sean Eiche, Owego, NY (US); James Patterson, Owego, NY (US); Kenneth R. Twigg, Sayre, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 55 days.

(21) Appl. No.: 14/511,549

(22) Filed: Oct. 10, 2014

(65) Prior Publication Data

US 2016/0105970 A1 Apr. 14, 2016

(51) Int. Cl.
*H05K 1/11* (2006.01)
*H05K 1/05* (2006.01)
*H05K 1/09* (2006.01)
*H05K 13/00* (2006.01)
*H05K 1/02* (2006.01)
*H05K 3/06* (2006.01)

(52) U.S. Cl.
CPC ............ *H05K 1/0284* (2013.01); *H05K 3/06* (2013.01); *H05K 2201/0179* (2013.01); *H05K 2201/0317* (2013.01); *H05K 2201/09872* (2013.01)

(58) Field of Classification Search
CPC combination set(s) only.
See application file for complete search history.

(56) References Cited

U.S. PATENT DOCUMENTS

| 4,574,331 A | 3/1986 | Smolley |
| 4,859,188 A | 8/1989 | Neumann |
| 4,940,623 A | 7/1990 | Bosna |
| 5,286,417 A | 2/1994 | Mahmoud et al. |
| 5,315,481 A | 5/1994 | Smolley |
| 5,368,883 A | 11/1994 | Beaver |

(Continued)

FOREIGN PATENT DOCUMENTS

| EP | 1020874 A1 | 7/2000 |
| EP | 1840964 A1 | 10/2007 |

(Continued)

OTHER PUBLICATIONS

Nonfinal Office Action dated Oct. 13, 2016, in U.S. Appl. No. 14/993,197.

(Continued)

*Primary Examiner* — Telly Green
(74) *Attorney, Agent, or Firm* — Miles & Stockbridge PC

(57) ABSTRACT

A method of producing a non-planar conforming circuit on a non-planar surface includes creating a first set of conforming layers. The first set of conforming layers is created by applying an oxide dielectric layer to the surface, applying a conductive material layer to the oxide dielectric layer, applying a resist layer to the conductive material layer, patterning the resist layer according to a desired circuit layout, etching the surface to remove exposed conductive material, and stripping the resist layer. The process may be repeated to form multiple layers of conforming circuits with electrical connections between layers formed by blind microvias. The resulting set of conforming layers can be sealed.

11 Claims, 2 Drawing Sheets

(56) References Cited

U.S. PATENT DOCUMENTS

| | | | |
|---|---|---|---|
| 5,427,304 | A | 6/1995 | Woods et al. |
| 5,608,434 | A | 3/1997 | Wilson et al. |
| 5,738,797 | A | 4/1998 | Belke, Jr. et al. |
| 5,938,455 | A | 8/1999 | Glovatsky et al. |
| 6,100,200 | A | 8/2000 | Van Buskirk |
| 6,188,582 | B1 | 2/2001 | Peter |
| 6,198,630 | B1 | 3/2001 | Cromwell |
| 6,264,476 | B1 | 7/2001 | Li et al. |
| 6,370,770 | B1 | 4/2002 | Fan et al. |
| 6,386,890 | B1 | 5/2002 | Bhatt et al. |
| 6,574,114 | B1 | 6/2003 | Brindle et al. |
| 6,593,900 | B1 | 7/2003 | Craven |
| 6,695,623 | B2 | 2/2004 | Brodsky et al. |
| 7,188,282 | B2 | 3/2007 | Walmsley |
| 7,302,592 | B2 | 11/2007 | Shipton et al. |
| 7,815,475 | B2 | 10/2010 | Peloza et al. |
| 8,686,522 | B2 | 4/2014 | Webb |
| 8,772,745 | B1 | 7/2014 | Gonya et al. |
| 8,880,139 | B1 * | 11/2014 | Etzkorn ............. G01N 27/3271 204/403.01 |
| 8,963,316 | B2 | 2/2015 | Hsu |
| 9,087,617 | B2 | 7/2015 | Gonya et al. |
| 9,263,400 | B2 | 2/2016 | Gonya et al. |
| 9,894,760 | B2 * | 2/2018 | Gonya ................ H05K 1/0298 |
| 2002/0098721 | A1 | 7/2002 | Fan et al. |
| 2004/0074088 | A1 | 4/2004 | Nakamura |
| 2004/0157370 | A1 * | 8/2004 | Gardner ............. H01F 17/0006 438/106 |
| 2004/0199786 | A1 | 10/2004 | Walmsley |
| 2004/0227205 | A1 | 11/2004 | Walmsley |
| 2008/0113505 | A1 * | 5/2008 | Sparks ............. H01L 21/76898 438/637 |
| 2008/0173698 | A1 | 7/2008 | Marczi et al. |
| 2008/0244898 | A1 | 10/2008 | Shacklette et al. |
| 2010/0031064 | A1 | 2/2010 | Walmsley |
| 2010/0213590 | A1 | 8/2010 | Warren |
| 2010/0230806 | A1 | 9/2010 | Huang |
| 2010/0255312 | A1 | 10/2010 | Dougherty et al. |
| 2011/0031982 | A1 | 2/2011 | Leon et al. |
| 2011/0049684 | A1 | 3/2011 | Lee |
| 2011/0090658 | A1 | 4/2011 | Adams et al. |
| 2011/0120764 | A1 | 5/2011 | Kelley |
| 2011/0227603 | A1 | 9/2011 | Leon et al. |
| 2011/0233766 | A1 | 9/2011 | Lin |
| 2012/0146182 | A1 | 6/2012 | Oganesian |
| 2012/0185636 | A1 | 7/2012 | Leon et al. |
| 2013/0026645 | A1 | 1/2013 | Mohammed |
| 2013/0093032 | A1 | 4/2013 | Webb |
| 2013/0207260 | A1 * | 8/2013 | Hsu ..................... H01L 23/48 257/738 |
| 2013/0292835 | A1 | 11/2013 | King |
| 2013/0333935 | A1 | 12/2013 | Gonya et al. |
| 2014/0041921 | A1 | 2/2014 | Gonya et al. |
| 2016/0105970 | A1 | 4/2016 | Gonya et al. |
| 2016/0128185 | A1 | 5/2016 | Gonya et al. |
| 2016/0155711 | A1 | 6/2016 | Gonya et al. |
| 2016/0338192 | A1 | 11/2016 | Gonya |

FOREIGN PATENT DOCUMENTS

| | | |
|---|---|---|
| WO | WO-2010/057145 A1 | 5/2010 |
| WO | WO-2011/046769 A1 | 4/2011 |
| WO | WO-2012/123400 A1 | 9/2012 |

OTHER PUBLICATIONS

Nonfinal Rejection dated Jan. 31, 2014, in U.S. Appl. No. 13/527,180.
Notice of Allowance dated Jul. 6, 2014, in U.S. Appl. No. 13/527,180.
Nonfinal Rejection dated Oct. 2, 2014, U.S. Appl. No. 14/325,670.
Notice of Allowance dated Mar. 17, 2015, in U.S. Appl. No. 14/325,670.
Nonfinal Office Action dated Aug. 14, 2015, in U.S. Appl. No. 14/789,885.
Notice of Allowance dated Sep. 23, in U.S. Appl. No. 13/570,605.
Notice of Allowance dated Oct. 1, 2015, in U.S. Appl. No. 14/789,885.
Nonfinal Office Action dated Mar. 24, 2016, in U.S. Appl. No. 15/014,160.
Notice of Allowance dated Jul. 28, 2016, in U.S. Appl. No. 15/014,160.
Nonfinal Office Action dated Sep. 2, 2016, in U.S. Appl. No. 15/222,333.
U.S. Appl. No. 15/367,642, filed Dec. 2, 2016, Gonya et al.
Final Rejection dated Dec. 21, 2016, in U.S. Appl. No. 15/222,333.
Nonfinal Office Action dated Mar. 14, 2017, in U.S. Appl. No. 15/367,642.
Final Office Action dated Mar. 23, 2017, in U.S. Appl. No. 14/993,197.
Advisory Action dated Mar. 27, 2017, in U.S. Appl. No. 15/222,333.
Nonfinal Office Action dated Apr. 28, 2017, in U.S. Appl. No. 15/222,333.
Notice of Allowance dated Oct. 4, 2017, in U.S. Appl. No. 14/993,197.
Nonfinal Office Action dated Oct. 12, 2017, in U.S. Appl. No. 15/222,333.
Notice of Allowance dated Jul. 6, 2017, in U.S. Appl. No. 15/367,642.
Final Office Action dated Apr. 2, 2018, in U.S. Appl. No. 15/222,333.
Notice of Allowance dated Aug. 3, 2018, in U.S. Appl. No. 15/222,333.

* cited by examiner

FINE LINE 3D NON-PLANAR CONFORMING CIRCUIT

FIELD

The present application relates to creating circuits on non-planar surfaces.

BACKGROUND INFORMATION

Wiring boards or printed circuit boards often use rigid planar substrates. Some techniques can be used to create ribbon cables, flexible cables typically used for connecting one printed circuit board to another.

Embodiments allow a circuit to be constructed on any suitable surface, such as a non-planar substrate. An example of such a surface may be a computer case or housing. Incorporating a circuit in such a way can reduce circuit space and weight.

SUMMARY

In one embodiment a method of producing a non-planar conforming circuit on a non-planar anodized surface includes creating a first set of conforming layers. The first set of conforming layers is created by applying an oxide dielectric layer to the surface, applying a conductive material layer to the oxide dielectric layer, applying a resist layer to the conductive material layer, patterning the resist layer according to a desired circuit layout, etching the surface to remove exposed conductive material, and stripping the resist layer. Next the resulting set of conforming layers can be sealed.

DETAILED DESCRIPTION

In one embodiment, an anodized non-planar structure can have a circuit fabricated directly on its surface. A mask can be applied to the surface to isolate the circuit area. A first circuit layer can be applied to the exposed area of the surface. The first circuit layer can be created by applying an oxide dielectric layer for planarizing and electrical isolation from the surface substrate. Onto this dielectric layer, conductive material can be deposited. A resist layer can then be added to the dielectric layer. The resist layer can be patterned using, for example, a laser lithographic technique to expose a negative of the desired circuit, leaving behind resist material matching the circuit pattern. Etching solution can be used appropriate to the conductive material to remove the exposed conductive material. The remaining resist layer can next be removed to expose the resulting circuit. If only one layer is desired, then the circuit can be sealed, using for example a parylene layer.

If additional circuit layers are desired, the next layer can be started by applying an additional oxide dielectric layer for electrical isolation. After applying the next dielectric layer for the next circuit layer, vias or holes can be drilled or etched in the oxide dielectric layer for connecting electrical traces on the two layers as the next conductive layer is applied or for the purpose of bringing an electrical access point from the first layer up to a higher layer. Several circuit layers can be built up in such a manner. The final circuit layer can be sealed for protection and electrical isolation from the remaining environment.

Each material layer of the circuit layer—the dielectric layer, the conductive material layer, and the resist layer—conforms to the contours of the non-planar surface so that each layer is also non-planar in the same way. For example, if the surface is curved, each layer also curves to match the radial bend of the surface and each subsequent layer.

Other approaches to build a conforming non-planar circuit could result in a much thicker circuit with a much wider pitch between circuit layers. Other approaches may use a dielectric layer that results in a rough topology which requires applying a much thicker conductive layer. A thinner circuit can be desirable because it allows more layers with less heat resistance and less internal thermal expansion. The method described in the present application achieves a thin circuit thickness and requires little processing.

Figure 1:
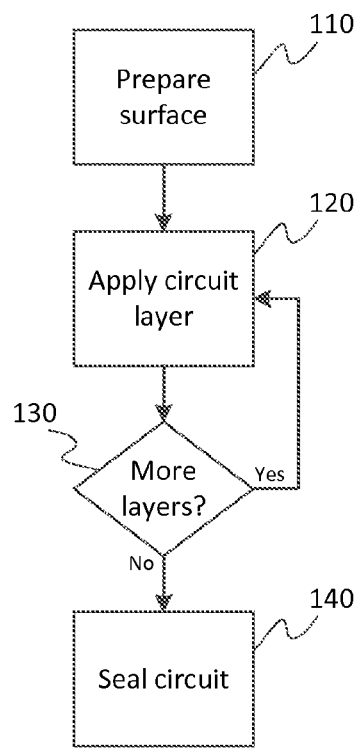
FIG. 1 is a flow diagram of the overall process of fabricating a contour conforming non-planar circuit in accordance with one embodiment.

FIG. 1 is a flow diagram of the overall process of fabricating a conforming non-planar 3D circuit in accordance with some embodiments. At 110, the non-planar surface is prepared. The surface can be machined and anodized. For example, an aluminum surface can be anodized to form an anodization layer of about 2.0 mils. The surface can be masked to limit the creation of the new circuit to a targeted area of the surface. At 120, the first circuit layer is applied. This will be described in further detail below in conjunction with the discussion of FIG. 2. At 130, it is determined whether any additional circuit layers are going to be applied. If so, the flow loops back to 120 where another circuit layer is applied. If not, at 140, the circuit is sealed. The circuit can be sealed using a parylene conformal coating layer, such as Parylene-C applied at about 0.25 mils thick. Other coating layers can be used, including Parylene-HT or an epoxy coating. To perform the coating and sealing, a tape mask can be applied suitable for parylene application. Liquid mask pads can be applied over portions of the circuit traces to make conductive pads. The coating can then be applied and tape masking removed. Liquid mask pads can be cut around and removed to expose part of the circuit traces for connecting points.

Figure 2:
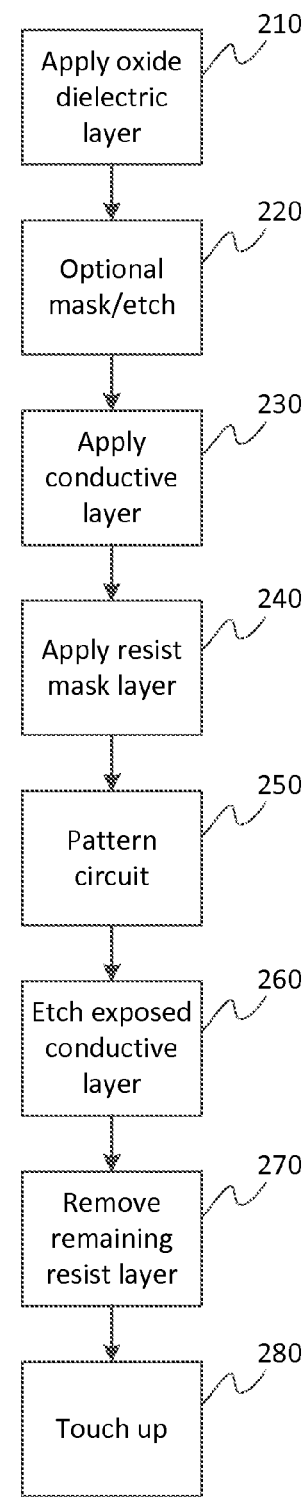
FIG. 2 is a flow diagram that details the creation of a circuit layer in accordance with one embodiment.

FIG. 2 is a flow diagram that details the creation of a circuit layer in accordance with some embodiments. At 210, a circuit layer is started by applying a dielectric layer. An oxide dielectric layer can be used. Prior to deposition, the surface can be cleaned using an ozone cleaning method. Then, for example, a layer of aluminum oxide ($Al_2O_3$) can be deposited over the surface using a physical vapor deposition ("PVD") technique. Other application techniques can be used. PVD allows a thin layer of the dielectric to be formed. PVD also results in a smooth substantially uniform thickness over the non-planar surface. This allows the conductive layer to be applied thinly. The oxide dielectric layer can be applied to about 0.3 mils thick or less. The oxide dielectric layer can be applied to the anodized surface or over a previous circuit layer. When applied over a previous circuit layer, the application will generally conform to the previous circuit layer, leaving a topography surface that mimics the previous circuit layer, but that appears substantially smooth due to the thinness of the circuit traces (e.g., 0.045 mils) versus the thinness of the dielectric layer (e.g. 0.3 mils). The resulting surface does not need to be smoothed prior to the application of another circuit layer because the subsequent layer will conform to the new surface. A fill material is not needed to fill these voids to make one circuit layer smooth before adding another circuit layer on top.

At 220, if a connection to a lower layer is desired, the oxide dielectric layer can optionally be masked and etched or drilled. Techniques for etching can include wet etching or plasma etching. Piercing the oxide layer by drilling or etching can allow a conductive layer applied in a second circuit layer, for example, to make contact with a conductor located in a first circuit layer forming a blind via electrical connection between layers.

At 230, a conductive layer is applied to the oxide dielectric layer. The conductive layer can be made up from several different conductors having different conductive and thermal properties. For example, in some embodiments a seed layer of titanium can be sputtered onto the dielectric, followed by a sputtered copper layer, followed by optional gold plating. One of skill in the art will understand that different conductive materials or deposition techniques can be substituted as desired. In some embodiments, the titanium layer can be sputtered at about 0.005 mils (200 Å) thick or less, the copper layer can be sputtered at about 0.02 mils (0.5 μm) thick or less, and the gold plating can be applied to about 0.02 mils (0.5 μm) thick or less. Therefore, under some embodiments, the conductive layer can be about 0.045 mils or less thick in total (or about 0.35 mils or less thick including the dielectric layer). Thin circuit layers can significantly reduce thermal resistance to the frame of the non-planar surface for improved heat sinking. The masking for applying the dielectric and conductive layers can be removed.

At 240, a resist mask layer is applied. The resist layer can be sprayed or electroplated onto the conductive layer and cured. The resist layer can be made from any material suitable for protecting conductive members from etching solutions. At 250, the circuit is patterned into the resist mask layer. In some embodiments, the circuit is patterned using laser lithography technology. The resist layer can pattern circuit traces down to 2 mils or less width and up to a width that covers the entire layer to be patterned (as with a ground isolation layer). Thus, trace widths can vary within the topography of the layer according to the circuit layer pattern. A pattern can be created and loaded into a laser lithography machine. The laser lithography machine ablates away the resist layer exposing a negative of the circuit layout. In some embodiments, portions of the circuit is patterned using circuit traces at about 2 mils or less wide and spaces between traces at about 3 mils or less wide, for an overall pitch of about 5 mils or less from trace to trace. The resist layer can be touched up as necessary prior to etching.

At 260, the circuit is exposed to etching solution. The circuit can be masked to prevent etching solution from affecting other surfaces. Etching solution for each conductive material can be applied successively to etch away conductive material to expose the oxide dielectric. In some embodiments, first a gold etching solution would be used, followed by a copper etching solution, followed by a titanium etching solution. One of skill in the art will recognize that other etching solutions can be used based on the conductive material in the conductive layer. Following etching, these conductive materials have been removed from the unprotected exposed areas of the circuit, such as those areas not covered by the resist mask.

At 270, the remaining resist layer is removed, exposing the completed circuit traces. A bright dip cleanup process can be used to remove any residues. At 280, circuit lines can be inspected and repaired as needed.

If additional circuit layers are desired, as in step 130 of FIG. 1, the flow would continue back to flow element 210 to apply another layer of oxide dielectric as a base to the next layer. If additional circuit layers are not needed, then the circuit would be sealed as described above with respect to flow element 140 of FIG. 1.

Figure 3:
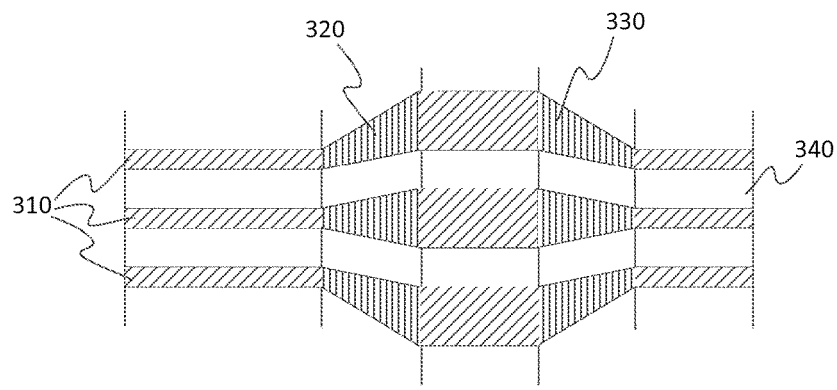
FIG. 3 is an illustration that depicts a top down view of a portion of a non-planar 3D circuit in accordance with one embodiment.

FIG. 3 is an illustration that depicts a top down view of a portion of a non-planar circuit in accordance with some embodiments. Three traces 310 are shown on a non-planar surface 340. The traces follow the contour of surface 340 by elevating over a rising slope 320 and running down a falling slope 330. One of skill in the art will understand that the illustration of FIG. 3 is an example and that additional traces can be added as desired. In addition, more complex non-planar geometries can be used including rounded portions, edges, and curves.

Figure 4:
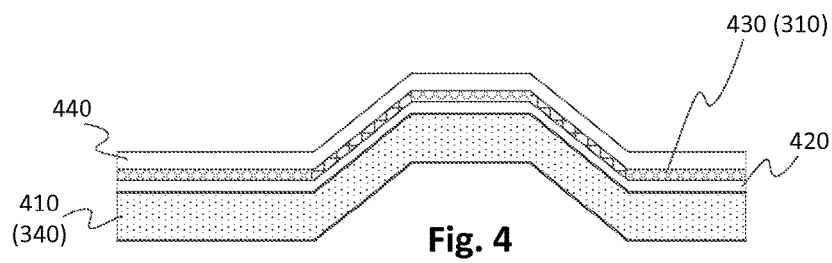
FIG. 4 is an illustration that depicts a longitudinal cross-sectional view of a portion of a non-planar 3D circuit in accordance with one embodiment.

FIG. 4 is an illustration that depicts a longitudinal cross-sectional view of a portion of a non-planar circuit in accordance with some embodiments. The view of FIG. 4 depicts the contour change of FIG. 3 at the perspective of the surface level, looking at a circuit section through one trace as it traverses from one end of FIG. 3 to the other end of FIG. 3. A surface 410 (340 of FIG. 3) is non-planar because it has a rising slope and a falling slope. A dielectric oxide layer 420 is formed on non-planar surface 410 (340) and conforms to the contours of surface 410 (340). A conductive trace 430 (one of conductors 310 of FIG. 3) is formed on dielectric oxide layer 420 and conforms thereto. A sealing layer 440 is formed on conductive layer 430 and conforms thereto. The distance between traces at void 510 is one part of the the overall circuit pitch, which is the distance between traces plus the width of the trace.

Figure 5:
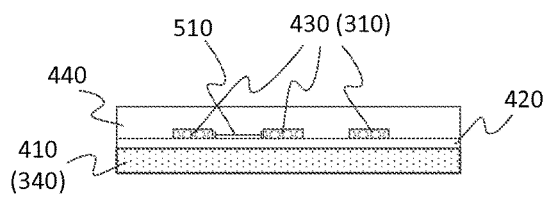
FIG. 5 is an illustration that depicts a cross-sectional view of a portion of a non-planar 3D circuit in accordance with one embodiment.
Figure 6:
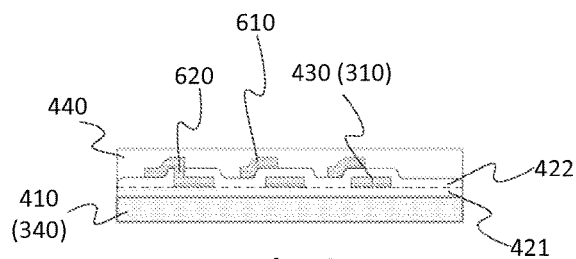
FIG. 6 is an illustration that depicts a cross-sectional view of a portion of a non-planar circuit in accordance with some embodiments.

One of skill in the art will appreciate that FIG. 4 (and FIGS. 5 and 6, below) is not in proportion. For example, dielectric layer 420 and sealing layer 440 are typically much thicker (e.g., 0.3 mils and 0.25 mils, respectively) than the circuit traces (e.g., 0.045 mils). In FIGS. 5 and 6, circuit trace 430 thickness (e.g., about 0.045 mils) is much thinner than the width of narrow traces (e.g., about 2 mils).

FIG. 5 is an illustration that depicts a cross-sectional view of a portion of a non-planar circuit in accordance with some embodiments. The view of FIG. 5 illustrates the conductive traces for a single layer circuit at the perspective of the surface level, looking at a circuit section from the end at the small cross-section of the three traces 310 of FIG. 3. Non-planar surface 410 is depicted at the base. Dielectric oxide layer 420 is formed on non-planar surface 410 and conforms to the contours of surface 410. Conductive traces 430 (conductors 310 of FIG. 3) are formed on dielectric oxide layer 420 and conform thereto. A sealing layer 440 is formed on conductive layer 430 and conforms thereto.

FIG. 6 is an illustration that depicts a cross-sectional view of a portion of a non-planar circuit in accordance with some embodiments. The view of FIG. 6 illustrates the same view as FIG. 5 except it depicts two layers of circuit traces. Non-planar surface 410 is depicted at the base. Dielectric oxide layers 421 and 422 are formed on non-planar surface 410 by two successive dielectric depositions (the second deposition after formation of the circuit layer) and conform to the contours of surface 410. Conductive traces 430 (conductors 310 of FIG. 3) are formed on dielectric oxide layer 420 and conform thereto. After the traces 430 have been formed, because an additional circuit layer is made, an additional dielectric oxide layer 422 is applied which conforms to the contour of the circuit traces 430. The dielectric oxide layer is continued to be applied until an appropriate thickness has been reached over the height of the conductive traces, such as 0.3 mils, as described above. Additional traces 610 are applied to the dielectric layer and the circuit is sealed with sealant 440. Conductive via 620 can be formed by etching the dielectric layer 420 prior to applying the second conductive layer, thereby forming conducive via 620 when the second conductive layer is sputtered onto the dielectric.

One of skill in the art will appreciate that in FIG. 6, the second dielectric deposition 422 (e.g., about 0.3 mils) is much thicker than circuit traces 430 and 610. As such, the bumps demonstrating the conformity of the second dielectric layer 422 to the first layer of circuit traces 430 and the conformity of the second layer of circuit traces 610 are exaggerated.

Several embodiments are specifically illustrated and/or described herein. However, it will be appreciated that modifications and variations of the disclosed embodiments are covered by the above teachings and within the purview of the appended claims without departing from the spirit and intended scope of the invention.

What is claimed is:

1. A non-planar conforming circuit, comprising:
   a non-planar surface;
   a first conforming oxide dielectric layer comprised of a dielectric material on the non-planar surface, wherein the first conforming oxide dielectric layer includes a portion having a thickness of no more than 0.3 mil;
   at least one first conforming circuit line comprised of a first conductive material on top of the first conforming oxide dielectric layer, wherein the at least one first conforming circuit line includes a portion having a thickness of no more than 0.05 mil, and wherein the first conductive material includes titanium, copper and gold;
   at least one second conforming oxide dielectric layer on the first conforming oxide dielectric oxide layer, wherein the at least one second conforming oxide dielectric layer surrounds the at least one first conforming circuit line on the dielectric material;
   at least one second conforming circuit line comprised of a second conductive material on top of the at least one second conforming oxide dielectric layer; and
   a conductive via extending through the at least one second conforming oxide dielectric layer, wherein the conductive via electrically connects the at least one first conforming circuit line to the at least one second conforming circuit line.

2. The non-planar conforming circuit of claim 1, wherein the at least one first conforming circuit line includes a portion having a width of no more than 2 mils.

3. The non-planar conforming circuit of claim 1, wherein the dielectric material is aluminum oxide.

4. The non-planar conforming circuit of claim 1, wherein the conforming oxide dielectric layer includes a portion having a thickness of no more than 0.3 mil.

5. The non-planar conforming circuit of claim 1, wherein the at least one second conforming circuit line includes a portion having a width of no more than 2 mils.

6. The non-planar conforming circuit of claim 1, wherein at least one additional conforming oxide dielectric layer is formed of aluminum oxide.

7. A non-planar conforming circuit, comprising:
   a first set of conforming layers including
      a conforming oxide dielectric layer on a non-planar surface; and
      a conforming layer on the conforming oxide dielectric layer, wherein the conforming layer is comprised of first circuit lines, the first circuit lines each including a portion having a thickness of no more than 0.05 mil, and
      wherein the conforming layer is formed of a conductive material including titanium, copper and gold;
   at least one additional set of conforming layers including
      at least one additional conforming oxide dielectric layer on the first circuit lines and the conforming oxide dielectric layer,
      at least one additional conforming layer on the at least one additional conforming oxide dielectric layer, wherein the at least one additional conforming layer is comprised of second circuit lines, and
      at least one conductive via extending through the at least one additional conforming oxide dielectric layer, wherein the at least one via extends between a conductor in the conforming layer and a conductor in the at least one additional conforming layer; and
   a sealing layer sealing the first set of conforming layers and the at least one additional set of conforming layers.

8. The non-planar conforming circuit of claim 7, wherein at least one of the conforming oxide dielectric layer and the at least one additional conforming dielectric layer is comprised of aluminum oxide applied.

9. The non-planar conforming circuit of claim 7, wherein the first circuit lines each include a portion having a width of no more than 2 mils.

10. The non-planar conforming circuit of claim 7, wherein the conforming oxide dielectric layer includes a portion having a thickness of no more than 0.3 mil.

11. The non-planar conforming circuit of claim 7, wherein the second circuit lines each include a portion having a width of no more than 2 mils.

* * * * *